United States Patent
Yoshioka

(10) Patent No.: US 9,508,787 B2
(45) Date of Patent: Nov. 29, 2016

(54) SEMICONDUCTOR DEVICE

(71) Applicant: Mitsubishi Electric Corporation, Tokyo (JP)

(72) Inventor: Takaaki Yoshioka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/931,895

(22) Filed: Nov. 4, 2015

(65) Prior Publication Data
US 2016/0218170 A1    Jul. 28, 2016

(30) Foreign Application Priority Data
Jan. 23, 2015    (JP) .................................. 2015-011586

(51) Int. Cl.
| H01L 23/66 | (2006.01) |
| H01L 23/522 | (2006.01) |
| H01L 21/768 | (2006.01) |
| H01L 27/06 | (2006.01) |
| H01L 49/02 | (2006.01) |

(52) U.S. Cl.
CPC .............. H01L 28/20 (2013.01); H01L 23/66 (2013.01); H01L 27/0682 (2013.01); H01L 28/10 (2013.01); H01L 28/40 (2013.01); *H01L 2223/6683* (2013.01); *H01L 2224/49175* (2013.01); *H01L 2924/0002* (2013.01)

(58) Field of Classification Search
USPC ........................................................ 257/536
See application file for complete search history.

(56) References Cited

U.S. PATENT DOCUMENTS

| 5,287,072 A * | 2/1994 | Kojima | H01L 29/41758 257/275 |
| 6,303,950 B1* | 10/2001 | Kurusu | H01L 29/4175 257/275 |
| 9,071,199 B2* | 6/2015 | Miwa | H03F 3/16 |
| 2002/0074162 A1* | 6/2002 | Su | H01L 23/49838 174/262 |
| 2002/0186091 A1* | 12/2002 | Maeda | H01L 23/66 333/35 |
| 2003/0080725 A1* | 5/2003 | Kodato | G01R 21/04 324/95 |
| 2004/0145034 A1* | 7/2004 | Fujioka | H01L 23/66 257/664 |
| 2006/0076620 A1* | 4/2006 | Akamine | H01L 23/4824 257/341 |
| 2007/0023897 A1* | 2/2007 | Nakajima | H01L 23/3107 257/728 |
| 2009/0008774 A1* | 1/2009 | Akamine | H01L 23/4824 257/728 |
| 2013/0106503 A1* | 5/2013 | Kajii | H01L 23/66 327/552 |
| 2014/0312457 A1* | 10/2014 | Li | H01L 21/76 257/531 |

FOREIGN PATENT DOCUMENTS

| JP | H10-335575 A | 12/1998 |
| JP | H11-103205 A | 4/1999 |

* cited by examiner

*Primary Examiner* — Ha Tran T Nguyen
*Assistant Examiner* — Thai T Vuong
(74) *Attorney, Agent, or Firm* — Studebaker & Brackett PC

(57) ABSTRACT

Two rows of resistive bodies, first resistive body and second resistive body, having slits are provided on an input matching circuit substrate. Since a high-frequency signal flows through not only the resistive bodies but also a transmission line pattern formed in the slits, the burnout of the resistive bodies can be prevented.

6 Claims, 7 Drawing Sheets

SEMICONDUCTOR DEVICE

BACKGROUND OF THE INVENTION

1. Field of the Invention

The present invention relates to a semiconductor device including an internally matched or pre-matched power amplifier for use in, for example, a microwave or millimeter wave bands or the like.

2. Background Art

Japanese Patent Laid-Open No. H10-335575 discloses an internally matched semiconductor device including an FET chip (amplifier). A high-frequency signal transmission line of this semiconductor device has a sheet-shaped resistive body formed therein.

In some cases, to reduce an oscillation of a semiconductor device, a resistor is connected in series with an input matching circuit (impedance conversion circuit disposed between an input terminal of a package and an amplifier). For example, a thin-film resistor is disposed in series on a main line of an MIC substrate (microwave integrated circuit substrate) in the package.

However, there has been a problem that the thin-film resistor is burned out when an excessive high-frequency signal is inputted to the amplifier, depending on the shape of the thin-film resistor. Moreover, there has also been a problem that a desired resistance value cannot be obtained in the case where there are limitations on the width of the thin-film resistor.

SUMMARY OF THE INVENTION

The present invention has been made to solve the above-described problems, and an object of the present invention is to provide a semiconductor device in which operation can be stabilized while the burnout of a resistor is avoided.

The features and advantages of the present invention may be summarized as follows.

According to one aspect of the present invention, a semiconductor device includes a package, an input electrode fixed to the package, an input matching circuit substrate provided in the package, a transmission line pattern formed on the input matching circuit substrate, a first resistive body formed on the input matching circuit substrate, the first resistive body having a first slit formed therein, a second resistive body formed on the input matching circuit substrate, the second resistive body having a second slit formed therein, an amplifier provided in the package, a first connecting body for electrically connecting the input electrode and the transmission line pattern, and a second connecting body for electrically connecting the transmission line pattern and the amplifier. The transmission line pattern exists in the first slit and the second slit, and the first resistive body and the second resistive body are located between a first connection point and a second connection point, the first connection point being a point at which the first connecting body contacts the transmission line pattern, the second connection point being a point at which the second connecting body contacts the transmission line pattern.

Other and further objects, features and advantages of the invention will appear more fully from the following description.

BRIEF DESCRIPTION OF THE DRAWINGS

FIG. 2 is an enlarged view showing the resistive body and the like;

DETAILED DESCRIPTION OF THE PREFERRED EMBODIMENTS

Semiconductor devices according to embodiments of the present invention will be described with reference to the drawings. The same or corresponding components will be denoted by the same reference signs, and the repetition of explanation thereof may be omitted.

First Embodiment

Figure 1:
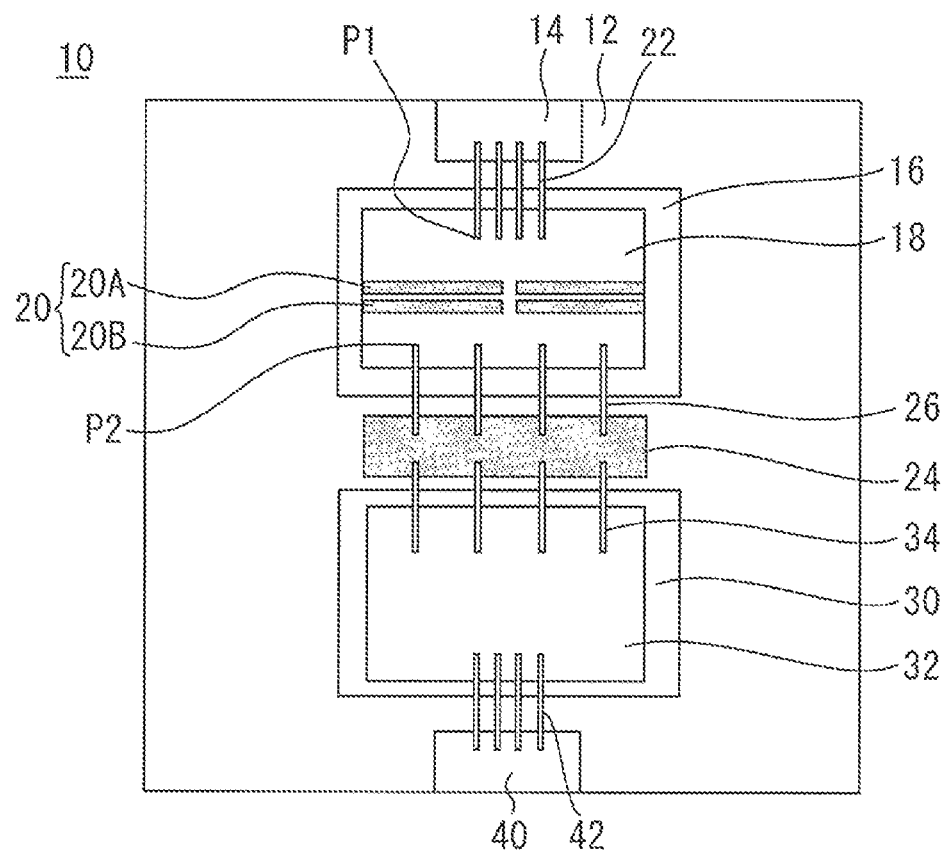
FIG. 1 is a plan view of a semiconductor device according to first embodiment.

FIG. 1 is a plan view of a semiconductor device 10 according to first embodiment of the present invention. The semiconductor device 10 includes a package 12. The package 12 is a metal package formed by, for example, plating copper with gold. An input electrode 14 and an output electrode 40 are fixed to the package 12. The input electrode 14 and the output electrode 40 are formed of, for example, feedthroughs.

An input matching circuit substrate 16 and an output matching circuit substrate 30 are provided in the package 12. The input matching circuit substrate 16 and the output matching circuit substrate 30 are, for example, high-permittivity substrates. The input matching circuit substrate 16 has a transmission line pattern 18 formed thereon. The input matching circuit substrate 16 is provided with a resistive body 20. The resistive body 20 is formed of, for example, a thin-film resistor.

Figure 2:
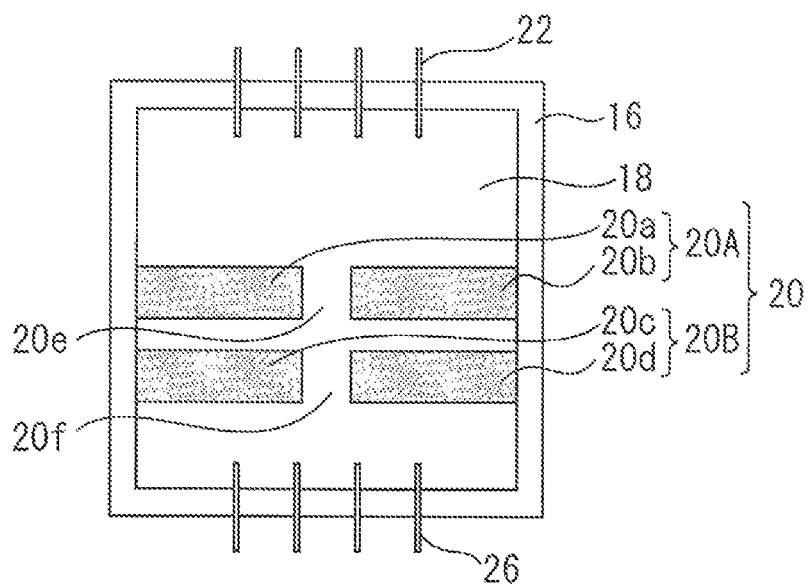

FIG. 2 is an enlarged view showing the resistive body 20 and the like. The resistive body 20 includes a first resistive body 20A and a second resistive body 20B. The first resistive body 20A has a linear shape with a first slit 20e. The second resistive body 20B has a linear shape with a second slit 20f. The transmission line pattern 18 exists in the first slit 20e and the second slit 20f. The width of the first resistive body 20A and the width of the second resistive body 20B are equal. The transmission line pattern 18 exists between the first resistive body 20A and the second resistive body 20B.

Referring back to FIG. 1, a transmission line pattern 32 is formed on the output matching circuit substrate 30. The input matching circuit substrate 16 and the transmission line pattern 18 are configured as, for example, an MIC substrate in which a thin-film pattern is provided on a ceramic substrate. The output matching circuit substrate 30 and the transmission line pattern 32 are also configured as, for example, an MIC substrate in which a thin-film pattern is provided on a ceramic substrate. The transmission line patterns 18 and 32 are metallized patterns plated with, for example, gold or the like.

An amplifier 24 is provided in the package 12. The amplifier 24 is, for example, an FET chip. The input electrode 14 and the transmission line pattern 18 are electrically connected to each other with first connecting bodies 22. The transmission line pattern 18 and the amplifier 24 are electrically connected to each other with second connecting bodies 26. The amplifier 24 and the transmission line pattern 32 are electrically connected to each other with connecting bodies 34. The transmission line pattern 32 and the output electrode 40 are electrically connected to each other with connecting bodies 42. The first connecting bodies 22, the second connecting bodies 26, and the connecting bodies 34 and 42 are, for example, wires, but may be other conductors such as ribbons.

The first resistive body 20A and the second resistive body 20B are located between first connection points P1, at which the first connecting bodies 22 contact the transmission line pattern 18, and second connection points P2, at which the second connecting bodies 26 contact the transmission line pattern 18.

Figure 3:
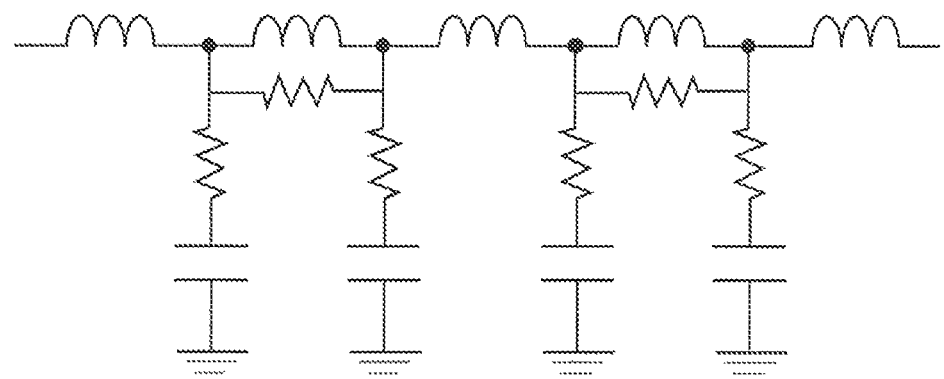
FIG. 3 is an equivalent circuit diagram of the semiconductor device.

Thus, the semiconductor device 10 constitutes an internally matched or pre-matched power amplifier in which MIC substrates for matching circuits and an amplifier are incorporated into the package. FIG. 3 is an equivalent circuit diagram of the semiconductor device 10. Next, the transmission of a high-frequency signal in the semiconductor device 10 will be described.

The input matching circuit substrate 16 and the transmission line pattern 18 function as an input matching circuit for converting the input impedance of the package 12 to the impedance of the amplifier 24. A high-frequency signal inputted to the input electrode 14 reaches the amplifier 24 through two different routes. The first route is a route passing through the resistive body 20 provided at a point in the transmission line pattern 18. The second route is a route passing through the transmission line pattern 18 provided in the first slit 20e and the transmission line pattern 18 provided in the second slit 20f without passing through the resistive body 20. In this way, the high-frequency signal passes through both of the resistive body 20 and the slits (first slit 20e and second slit 20f). Accordingly, the Joule heat generated in the resistive body 20 can be reduced compared to that in the case where a high-frequency signal passes through only a resistive body. Thus, the burnout of the resistive body 20 can be avoided.

Figure 4:
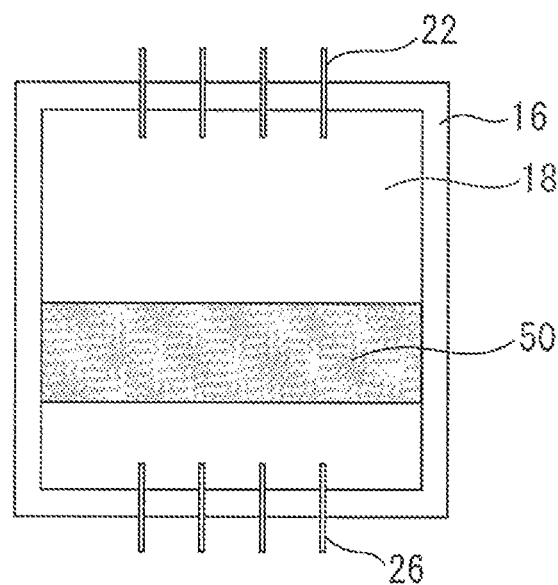
FIG. 4 is an enlarged view showing an input matching circuit substrate of a semiconductor device of the comparative example.
Figure 5:
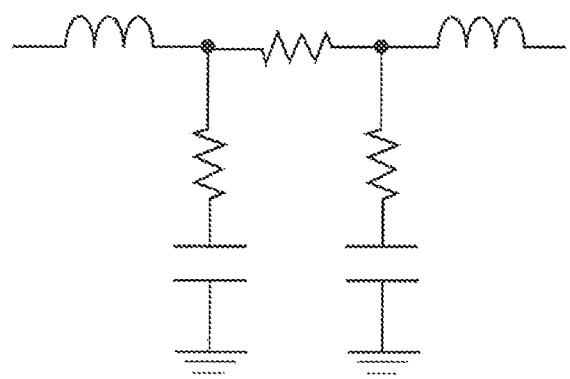
FIG. 5 is an equivalent circuit diagram of the semiconductor device of the comparative example.

To facilitate the understanding of features of the semiconductor device according to first embodiment of the present invention, a comparative example will be described. FIG. 4 is an enlarged view showing an input matching circuit substrate of a semiconductor device of the comparative example and surroundings of the input matching circuit substrate. In the comparative example, a resistive body 50 is formed of a single strip of a thin-film resistor with no slit. Accordingly, a high-frequency signal always passes through the resistive body. FIG. 5 is an equivalent circuit diagram of the semiconductor device of the comparative example.

Figure 6:
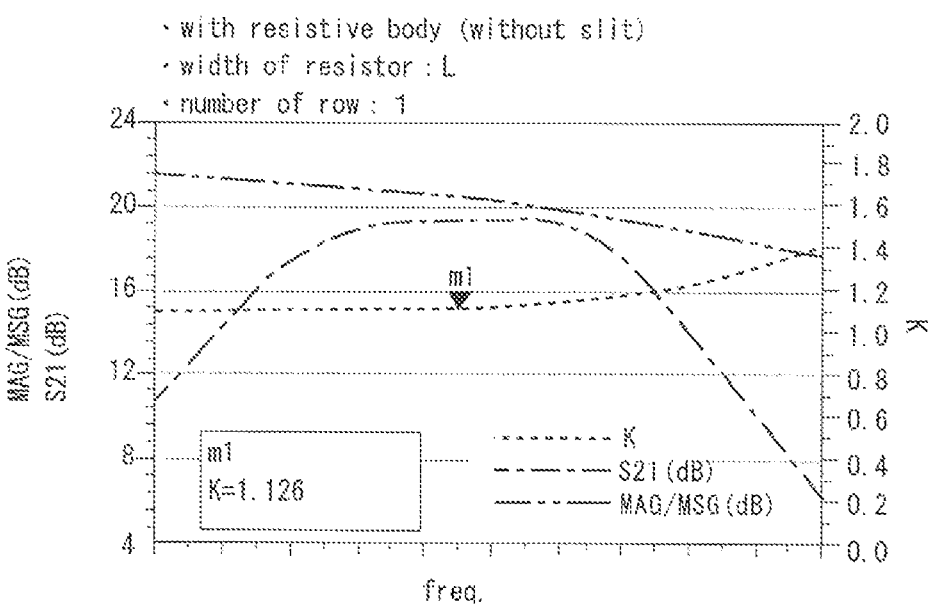
FIG. 6 shows frequency dependence of various characteristics of the semiconductor device of the comparative example.
Figure 7:
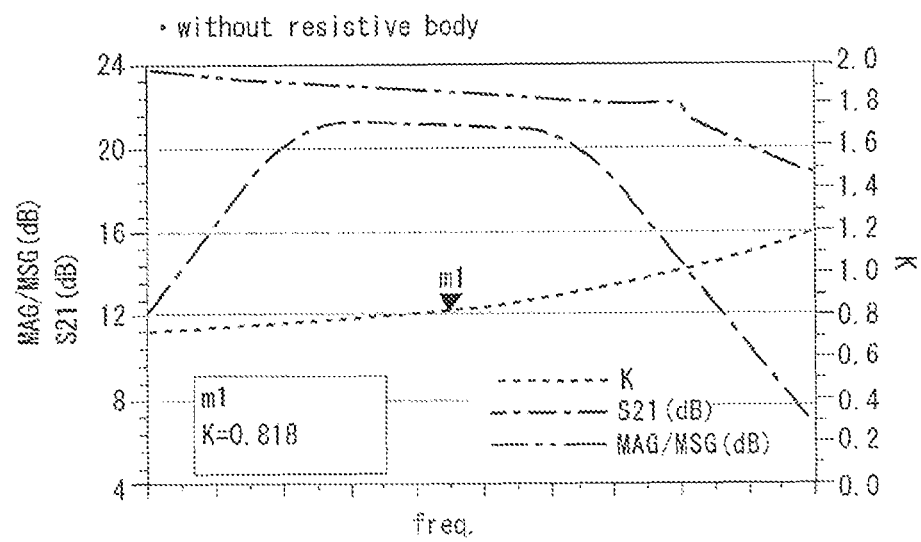
FIG. 7 shows frequency characteristics for the case where no resistive body is provided.

FIG. 6 is a graph showing the frequency dependence of various characteristics of the semiconductor device of the comparative example. The resistive body 50 of the comparative example has no slit and therefore has a high stability factor K of 1.126. In other words, the semiconductor device of the comparative example has high operation stability. However, since the whole of a high-frequency signal is transmitted through the resistive body 50, the resistive body 50 may be burned out. Meanwhile, operation stability cannot be ensured without a resistive body. Frequency characteristics for the case where no resistive body is provided are shown in FIG. 7. As shown in FIG. 7, in the case where no resistive body is provided, the stability factor K is as low as 0.818.

Figure 8:
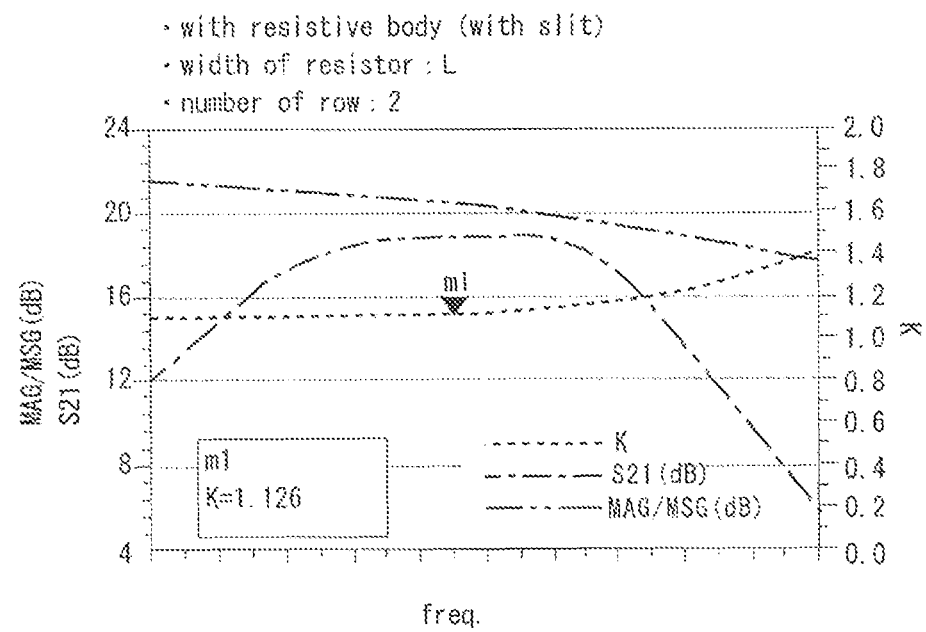
FIG. 8 shows frequency dependence of various characteristics of the semiconductor device according to first embodiment.

FIG. 8 is a graph showing the frequency dependence of various characteristics of the semiconductor device 10 according to first embodiment of the present invention. Since two rows of resistive bodies (first resistive body 20A and second resistive body 20B) having slits are provided, the stability factor K is 1.126, and favorable stability can be obtained. Moreover, since a high-frequency signal flows through not only the resistive body 20 but also the transmission line pattern 18 in the first slit 20e and the second slit 20f, the burnout of the resistive body 20 can be prevented. Accordingly, in the semiconductor device 10 according to first embodiment of the present invention, operation can be stabilized while the burnout of the resistor is avoided.

Figure 9:
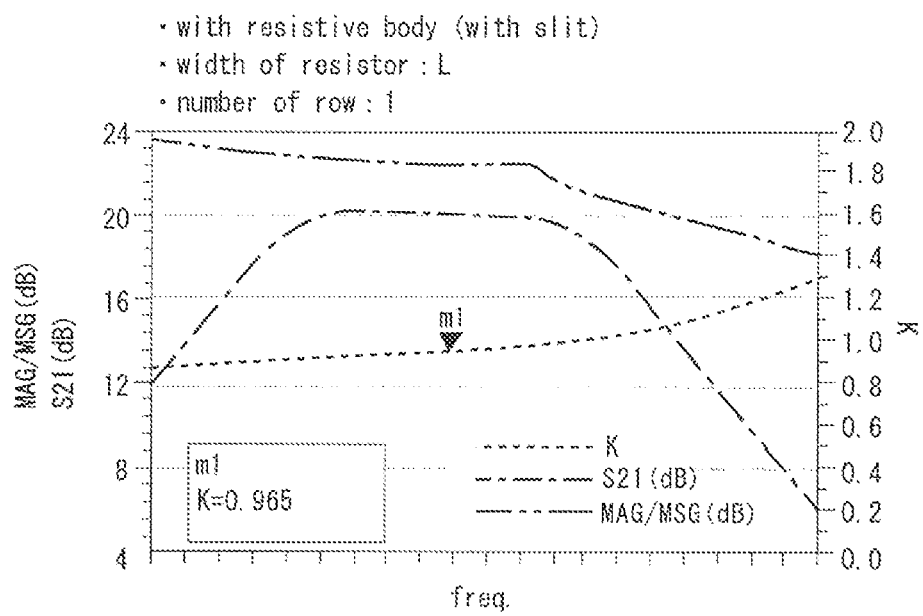
FIG. 9 shows frequency dependence of various characteristics for the case where one resistive body is provided.

FIG. 9 is a graph showing the frequency dependence of various characteristics for the case where the first resistive body 20A or the second resistive body 20B is omitted. The stability factor K for the case where there is only one resistive body with a slit is as low as 0.965. Specifically, since sufficient stability cannot be obtained in the case where there is only one resistive body with a slit, a plurality of resistive bodies with slits need to be provided. In other words, since providing a slit in a resistive body reduces the resistance value compared to that for the case where the resistive body has no slit, a plurality of resistive bodies are needed.

Figure 10:
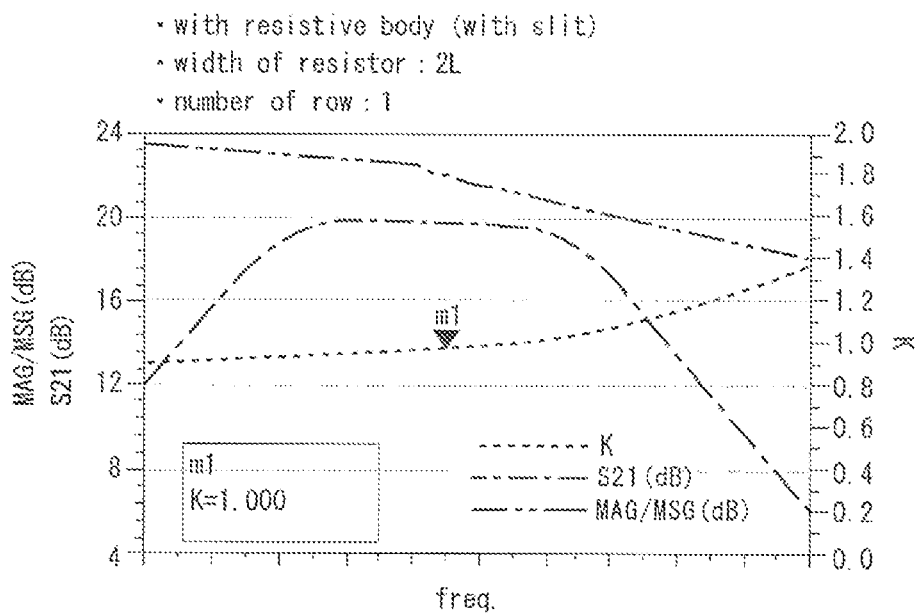
FIG. 10 shows frequency dependence of various characteristics for the case where the width of the resistive body is doubled.

FIG. 10 is a graph showing the frequency dependence of various characteristics for the case where the width of the first resistive body is doubled and where the second resistive body is omitted. In that case, the resistance value hardly increases, and the stability factor K is as low as 1.000. Accordingly, to obtain sufficient stability, a plurality of rows of resistive bodies need to be provided as in the semiconductor device 10 of first embodiment.

Figure 11:
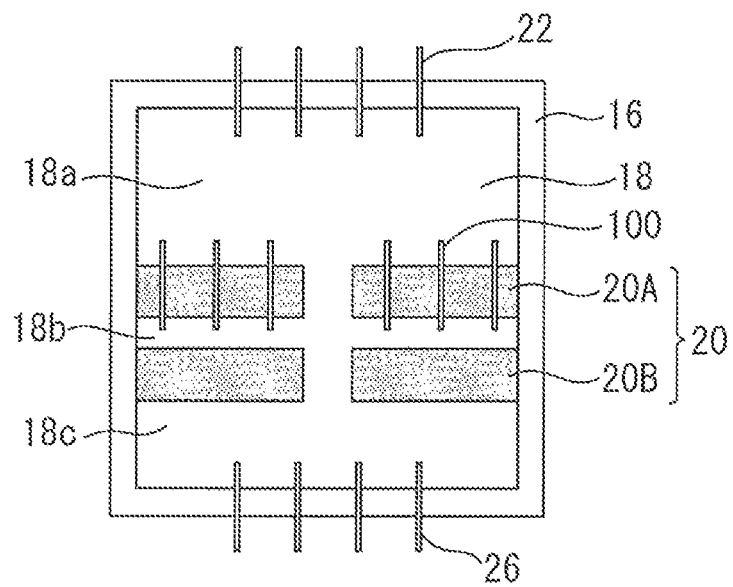
FIG. 11 is a plan view showing an input matching circuit substrate of a semiconductor device according to a modified example.

FIG. 11 is a plan view showing an input matching circuit substrate and the like of a semiconductor device according to a modified embodiment. Third connecting bodies 100 cross the first resistive body 20A to connect an upper portion 18a of the transmission line pattern 18 above the first resistive body 20A and a portion 18b of the transmission line pattern 18 between the first resistive body 20A and the second resistive body 20B. Thus, a high-frequency signal does not pass through the first resistive body 20A. Accordingly, the resistance value can be reduced compared to that in the configuration of FIG. 2. Thus, the resistance value can be adjusted (reduced) by providing the third connecting bodies. The third connecting bodies may connect the upper portion 18a and a lower portion 18c. The first connecting bodies 22 may be connected directly to a portion (portion 18b) of the transmission line pattern 18 between the first resistive body 20A and the second resistive body 20B.

First embodiment of the present invention includes two resistive bodies having slits formed therein, but three or more such resistive bodies may be provided. Effects of the present invention can be obtained by providing a plurality of rows of resistive bodies having slits in series on a signal line.

Part of the transmission line pattern 18 has been provided between the first resistive body 20A and the second resistive body 20B. However, in the case where wires are not bonded between the first resistive body 20A and the second resistive body 20B, such a transmission line pattern is unnecessary.

These modifications can also be applied to semiconductor devices according to embodiments below. It should be noted that the semiconductor devices according to the embodiments below have many things in common with that of first embodiment, and therefore differences from first embodiment will be mainly described.

Second Embodiment

Figure 12:
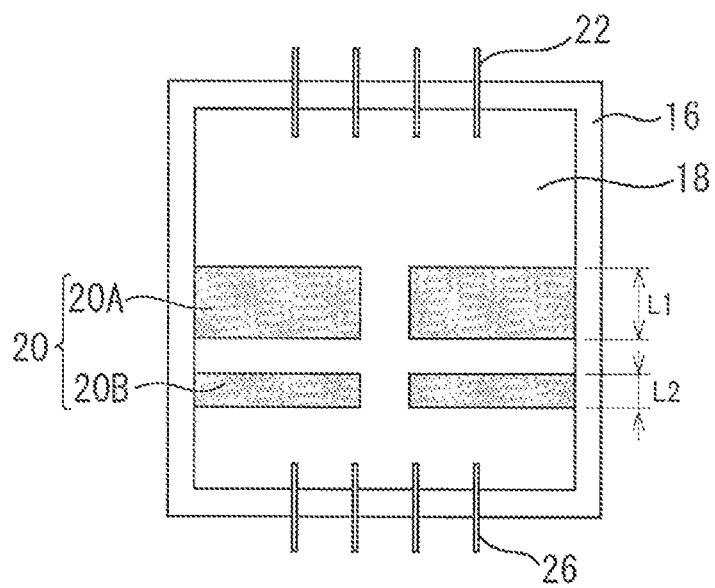
FIG. 12 is a plan view showing an input matching circuit substrate of a semiconductor device according to second embodiment.

FIG. 12 is a plan view showing an input matching circuit substrate and the like of a semiconductor device according to second embodiment of the present invention. The width L1 of the first resistive body 20A is larger than the width L2 of the second resistive body 20B. By making the width of the first resistive body 20A and the width of the second resistive body 20B different from each other in this way, the resistance value can be adjusted. Moreover, a desired resistance value can be realized by providing the third connecting bodies described in first embodiment.

Third Embodiment

Figure 13:
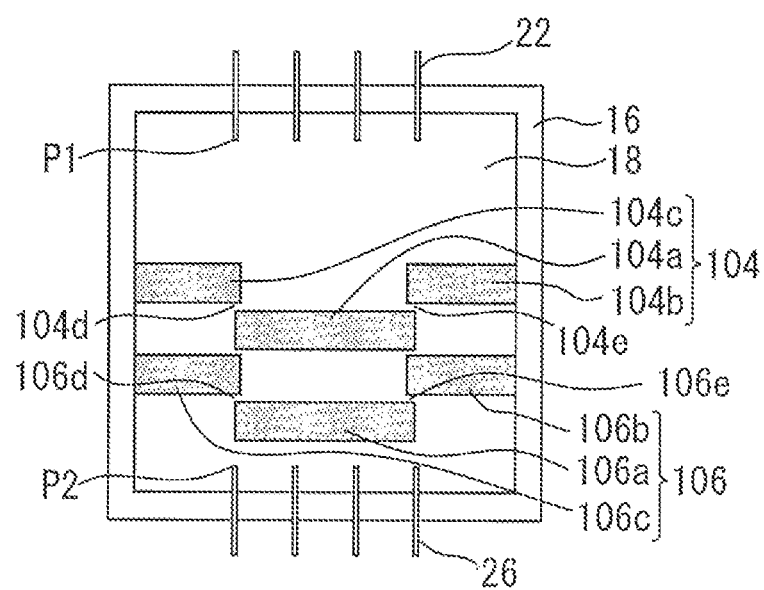
FIG. 13 is a plan view showing an input matching circuit substrate of a semiconductor device according to third embodiment.

FIG. 13 is a plan view showing an input matching circuit substrate and the like of a semiconductor device according to third embodiment of the present invention. A first resistive body 104 includes a first portion 104a, a second portion 104b, and a third portion 104c. The first portion 104a is located below the second portion 104b and the third portion 104c. Accordingly, the distances from the first connection points P1 to the first portion 104a, the distances from the first connection points P1 to the second portion 104b, and the distances from the first connection points P1 to the third portion 104e are substantially equal. Specifically, each portion of the first resistive body 104 is located such that the distances from the first connection points P1 to different portions of the first resistive body are closer to each other than in the case where the first resistive body is formed in a linear shape.

A second resistive body 106 includes a first portion 106a, a second portion 106b, and a third portion 106c. The first portion 106a is located below the second portion 106b and the third portion 106c. Accordingly, the distances from the first connection points P1 to the first portion 106a, the distances from the first connection points P1 to the second portion 106b, and the distances from the first connection points P1 to the third portion 106c are substantially equal. Specifically, each portion of the second resistive body 106 is located such that the distances from the first connection points P1 to different portions of the second resistive body are closer to each other than in the case where the second resistive body is formed in a linear shape.

Since the first resistive body 104 and the second resistive body 106 are arranged as described above, a high-frequency signal evenly passes through resistive bodies on all routes. Accordingly, the stability of the semiconductor device can be improved.

As can be seen in FIG. 13, in the first resistive body 104, portions thereof on right sides of first slits 104d and 104e and portions thereof on left sides of the first slits 104d and 104e are formed to be shifted from each other; and, in the second resistive body 106, portions thereof on right sides of second slits 106d and 106e and portions thereof on left sides of the second slits 106d and 106e are formed to be shifted from each other. By providing portions of the resistive bodies in a staggered manner in this way, portions which produce heat when a high-frequency signal is inputted are distributed. Accordingly, the burnout of the resistive bodies can be prevented.

As described above, the semiconductor device according to third embodiment is stabilized by equalizing the distances from the first connection points P1 to different portions of the resistive bodies, and is given the effect of preventing the burnout of the resistive bodies by providing the resistive bodies in a staggered manner (shifted manner). However, even in the case where the resistive bodies are merely provided in a staggered manner without any consideration for the distances from the first connection points P1 to different portions of the resistive bodies, the effect of preventing the burnout of the resistive bodies can be obtained. It should be noted that features of the semiconductor devices according to the embodiments described above may be combined as appropriate.

In the present invention, providing a plurality of resistive bodies having slits makes it possible to stabilize the operation of a semiconductor device while avoiding the burnout of a resistor.

Obviously many modifications and variations of the present invention are possible in the light of the above teachings. It is therefore to be understood that within the scope of the appended claims the invention may be practiced otherwise than as specifically described.

What is claimed is:

1. A semiconductor device comprising:
   a package;
   an input electrode fixed to the package;
   an input matching circuit substrate provided in the package;
   a transmission line pattern formed on the input matching circuit substrate;
   a first resistive body formed on the input matching circuit substrate, the first resistive body having a first slit formed therein;
   a second resistive body formed on the input matching circuit substrate, the second resistive body having a second slit formed therein;
   an amplifier provided in the package;
   a first connecting body for electrically connecting the input electrode and the transmission line pattern; and
   a second connecting body for electrically connecting the transmission line pattern and the amplifier,
   wherein the transmission line pattern exists in the first slit and the second slit, and
   the first resistive body and the second resistive body are located between a first connection point and a second connection point, the first connection point being a point at which the first connecting body contacts the transmission line pattern, the second connection point being a point at which the second connecting body contacts the transmission line pattern.

2. The semiconductor device according to claim 1, wherein the transmission line pattern exists between the first resistive body and the second resistive body.

3. The semiconductor device according to claim 1, wherein a width of the first resistive body and a width of the second resistive body are equal to each other.

4. The semiconductor device according to claim 1, wherein a width of the first resistive body and a width of the second resistive body are different from each other.

5. The semiconductor device according to claim 1, wherein a portion of the first resistive body on a right side of the first slit and a portion of the first resistive body on a left side of the first slit are formed to be shifted from each other, and a portion of the second resistive body on a right side of the second slit and a portion of the second resistive body on a left side of the second slit are formed to be shifted from each other.

6. The semiconductor device according to claim 1, wherein
- each portion of the first resistive body is located such that distances from the first connection point to different portions of the first resistive body are closer to each other than in the case where the first resistive body is formed in a linear shape, and
- each portion of the second resistive body is located such that distances from the first connection point to different portions of the second resistive body are closer to each other than in the case where the second resistive body is formed in a linear shape.

* * * * *